United States Patent
Mazzoni et al.

[11] Patent Number: 5,863,406
[45] Date of Patent: Jan. 26, 1999

[54] METHOD OF MANUFACTURING A PRINTED CIRCUIT BOARD

[75] Inventors: Roberto Mazzoni, Carimate; Adelio Monzani, Cornate D'Adda; Vittorio Sirtori, Milan, all of Italy

[73] Assignee: International Business Machines Corp., Armonk, N.Y.

[21] Appl. No.: 809,334

[22] PCT Filed: Jul. 6, 1995

[86] PCT No.: PCT/EP95/02634

§ 371 Date: May 19, 1997

§ 102(e) Date: May 19, 1997

[87] PCT Pub. No.: WO97/02727

PCT Pub. Date: Jan. 23, 1997

[51] Int. Cl.[6] ............................ C25D 5/02; H05K 3/24; H05K 3/34
[52] U.S. Cl. ............................ 205/126; 29/840
[58] Field of Search .................. 205/126, 125; 29/840; 174/261, 263

[56] References Cited

U.S. PATENT DOCUMENTS

| | | | |
|---|---|---|---|
| 3,673,680 | 7/1972 | Tanaka et al. | 29/837 |
| 4,304,640 | 12/1981 | Walker | 361/748 |
| 4,487,654 | 12/1984 | Coppin | 216/18 |
| 4,525,246 | 6/1985 | Needhom | 205/125 |
| 5,024,734 | 6/1991 | Downs et al. | 205/125 |

FOREIGN PATENT DOCUMENTS

| | | |
|---|---|---|
| 0189975 | 8/1986 | European Pat. Off. . |
| 2473834 | 7/1981 | France . |
| 33 28 342 | 1/1985 | Germany . |
| 34 12 502 | 10/1985 | Germany . |

OTHER PUBLICATIONS

Kazunori Oki, Newest Technology Permits Washless Soldering, *JEE Journal of Electronic Engineering*, vol. 28, No. 298, Tokyo, pp. 74–78, Oct. 1991.

IBM Technical Disclosure Bulletin, vol. 32, No. 3B, Armonk, N.Y., pp. 36–37, "Solder Bump–Making Process." Aug. 1989.

IBM Technical Dislcosure Bulletin, vol. 35, No. 2, Jul. 1992, Armonk, NY, p. 19, "Volume Control Of Plated Solder Ped Arrays".

*Primary Examiner*—Kathryn L. Gorgos
*Assistant Examiner*—William T. Leader
*Attorney, Agent, or Firm*—Pollock, Vande Sande & Amernick

[57] ABSTRACT

A method of manufacturing a printed circuit board adapted for having surface mounted components positioned thereon including the step of selectively electroplating a thick solder layer (340) onto selected conductive projections (230). The selective electrodeposition is performed by electrolessly applying a conductive layer (310) onto the board (100) previously provided with circuit conductors (220) and conductive projections (230), providing a thick insulating mask (310) leaving exposed the selected conductive projections (230), and electroplating the thick solder layer (340). The method of manufacturing an electronic card by surface mounting of components (SMT) onto the printed circuit board (100) obtainable by the above-described method further includes the step of dispensing a flux, preferably a no-clean flux dispensed by syringe, onto the board (100), avoiding solder paste application or adhesive screening.

5 Claims, 11 Drawing Sheets

METHOD OF MANUFACTURING A PRINTED CIRCUIT BOARD

This is a national stage application of PCT/EP95/02634, filed on Jul. 6, 1995.

The present invention relates to a method of manufacturing a printed circuit board and to a method of manufacturing an electronic card; particularly, it relates to a method of manufacturing a printed circuit board for surface mounting of components thereon.

A printed circuit board (PCB) is an electronic package including a circuitized substrate for carrying one or more components, such as chips, transistors, capacitors, resistors and so on, to be connected to the circuit conductors thereof; the assembled device composed by the printed circuit board with the components connected thereto is generally called an electronic card.

In the Surface Mounting Technology (SMT), the substrate surface of the PCB is provided with conductive projections, such as pads and lands (when surrounding a through-hole of the board), for connecting to electrical contacts of the components. Solder is deposited onto such conductive projections, for assembly of components onto the board, providing mechanical and electrical connection.

The SMT process commonly requires the board to be coated with electroless conductive material, typically copper. A further layer of conductive material is then electroplated onto the board and subsequently etched through an etching mask. After stripping the etching mask, an insulating material is applied onto the whole board and exposed with the exception of the selected conductive projections, in order to leave the same conductive projections free after developing. The solder may then be deposited onto the conductive projections, previously finished with different methods known in the art, such as ENTEK or HASL (Hot Air Solder Level). The ENTER method is described in "Surface investigation of copper in printed circuit board"—A. Manara, V. Sirtori—Surface and Interface analysis—1990—Vol. 15, Pag. 457–462, while the HASL method is described in "Soldering in electronics"—R. J. Klein Wassink—Ed. Electrochemical Publications.

A critical step in the SMT processes known in the art is the solder paste screening required as a first step in the assembly process of the finished printed circuit board. This step depends on many factors, including the solder paste rheology, that is its visco-elastic properties. The solder paste rheology is itself affected by a lot of parameters, as vehicle chemical composition, powder granulometry, vehicle powder mixing process. In addition, the screening operation is itself influenced by many factors, such as the machine setup, shape of stencil window, stencil cleaning frequency, operator skill.

A further emerging technology in the SMT field is the so called Flip Chip Attachment (FCA). It consists in bonding directly chips, provided with several ball contacts, onto small PCB conductive projections. This is a very complicated and difficult operation because of the very small dimensions of the conductive projections. Presently, the bonding of the chips onto the conductive projections is done with several different techniques, like the deposit of the solder by a dedicated and expensive machine that injects the melted solder on the conductive projections, or the screening of conductive adhesives or solder paste. The drawbacks of these methods are the cost of the solder injection machine and of the conductive adhesives and the high complexity and criticalness of the conductive adhesive and solder paste screening.

A method of electroplating solder onto selected areas of the conductors of a printed circuit board is described in U.S. Pat. No. 4,304,640. The method includes the steps of providing printed circuit conductors on the board, electroplating a conductive layer onto the whole surface, forming an insulating mask and electroplating the solder onto the selected areas of the conductors.

However, the described process is effective for selectively electroplating only a thin layer of solder onto the circuit conductors; the deposited layer can be used exclusively to protect the electroplated conductive layer (typically copper) from oxidation. The above described process cannot be applied for particular or general soldering processes, such as SMT, FCA, or similar.

A selective electrodeposition of a relatively thick layer of solder onto the conductive projections of a PCB for surface mounting of components thereon is not known in the art. It should be noted that the electrodeposition of a relatively thick layer implies a longer and more critical process (higher adherence and sealing between the insulating mask and the substrate) and the availability of a different insulating material (thicker and water soluble).

The above drawbacks of the prior art are overcome by the invention as claimed. Accordingly, the present invention provides a method of manufacturing a printed circuit board for surface mounting of components thereon, said method including the steps of providing circuit conductors and conductive projections onto said board and selectively electroplating a relatively thick solder onto said conductive projections.

The method according to the present invention provides for the selective electrodeposition of relatively thick solder only onto selected conductive projections and not onto circuit conductors; particularly, the method can be used to electroplate solder onto selected pads dedicated to the components soldering on both sides of a double-sided printed circuit board and in the holes of the same board.

The method according to the present invention replaces the successive solder paste screening performed in the SMT process with the selective electrochemical deposition (ECD) of relatively thick solder. The solder layer is electroplated only on the conductive projections dedicated to the component soldering, presently covered with the solder paste. The elimination of the screening improves significantly the process yield and it reduces the assembly cycle time and the man power.

Presently one operator must be dedicated to the solder paste or the conductive adhesive screener, whose setup (the matching of the board conductive projections with stencil window) is very critical because it requires a high mechanical precision on large surfaces. Moreover the stencil cleaning, while the machine is operating, is continuously necessary and so is the stencil washing at the end of the production resulting in loss of a lot of time.

Preferably, said step of selectively electroplating a relatively thick solder includes the steps of electrolessly applying a conductive layer onto said board, providing a relatively thick insulating mask onto said conductive layer leaving exposed selected conductive projections, electroplating said relatively thick solder onto said selected conductive projections and stripping said insulating mask.

The solder selective electroplating is obtained using the current process steps, excepting the electroless copper etching, only changing the process step sequence. No additional cost is then involved by the process according to this embodiment of the invention.

Typically, said insulating mask has a thickness comprised between 50 $\mu$m and 200 $\mu$m, with a preferred value of 75 $\mu$m.

In an advantageous embodiment of the present invention, said insulating mask is a dry film. The dry film offers a higher adherence and sealing with the substrate, it is thicker and water soluble; in addition, the dry film deposition offers a good geometrical definition.

Preferably, the above described method further includes the step of electroplating a conductive material onto said selected conductive projections before the step of electroplating said relatively thick solder. This conductive material is useful to ensure a better electrical connection between the circuits on either face of the board.

In a typical process of manufacturing a PCB, said step of providing circuit conductors and conductive projections includes the steps of providing a conductive coating onto said board, providing an etching mask onto said conductive coating for masking said circuit conductors and conductive projections, etching said board and stripping said etching mask.

Advantageously, said board is a multilayer board. The use of several layers serves to reduce the additional cost involved by the process according to the present invention. The manufacturing cost of a PCB is in fact proportional to the number of layers included in the same board; on the contrary, the additional cost involved by the selective electrodeposition of the solder is a fixed amount. Therefore, the use of a multilayer board reduces the additional cost impact with regard to the total cost of the board.

In a different embodiment of the present invention, a method of manufacturing an electronic card by surface mounting of components onto a printed circuit board is provided, said method including the steps of manufacturing said board according to the above described method and then dispensing a flux onto said board.

An advantage of the process according to the present embodiment of the invention with respect to the prior art is due to the far less critical flux dispensing operation with regard to the solder paste screening of the methods known in the art. The flux is indeed a homogeneous organic material (contrarily to the solder paste and the conductive adhesive that are a suspension of a powder in an organic matrix) whose rheology is stable and well controlled.

Different kinds of fluxes can be used in the above described methods, either water soluble or no clean. Preferably, said flux is a no clean flux; a further advantage of this embodiment of the invention is that no cleaning operations are necessary and a single operator is enough to manage contemporary the flux dispensing and component placement machine.

The flux can be dispensed by several methods, such as screening, spray, roll, syringe. In a particular advantageous embodiment, said flux is dispensed by a syringe; the flux dispensing by syringe is a very simple, quick, repeatable and clean method.

Moreover, the printed circuit board and the electronic card obtainable by the above described methods are disclosed.

BRIEF DESCRIPTION OF THE DRAWINGS

Various embodiments of the invention will now be described in detail by way of examples, with reference to accompanying figures, where.

Figure 1:
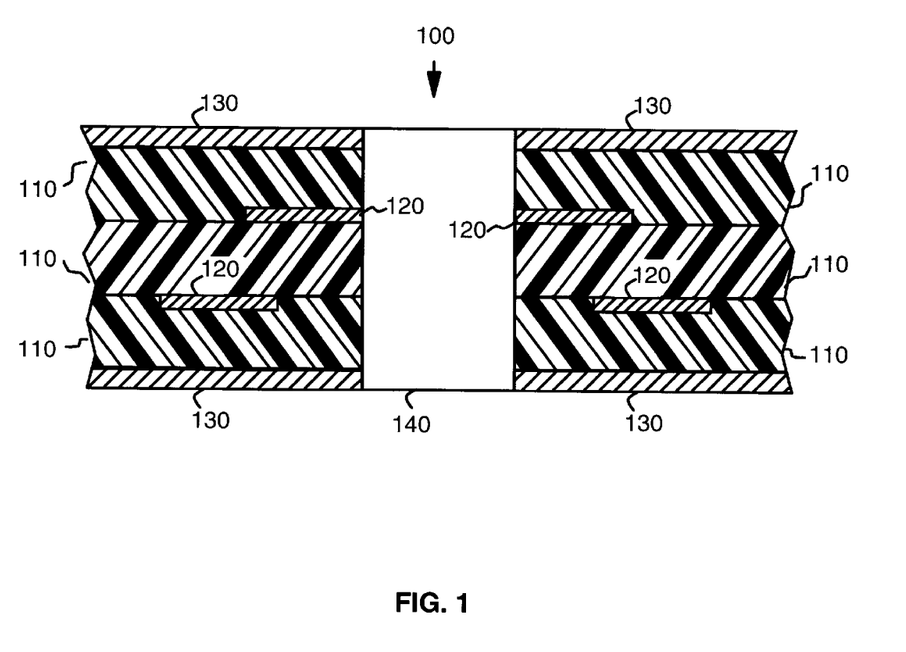
FIG. 1 is a schematic representation of a PCB after drilling.

With reference now to the figures and in particular with reference to FIG. 1, a schematic representation of a PCB after drilling is depicted (all previous production operations are well known in the art and are therefore omitted in the present description). The multilayer printed circuit board 100 is shown through a cross-section of a portion thereof.

The method of this embodiment of the present invention will be described with reference to the production of a multilayer double sided printed circuit board having a through-connection between the two circuits on the opposite faces of the board. The use of several layers serves to reduce the additional cost involved by the process according to the present invention. The manufacturing cost of a PCB is in fact proportional to the number of layers included in the same board; on the contrary, the additional cost involved by the selective electrodeposition of the solder is a fixed amount. Therefore, the use of a multilayer board reduces the additional cost impact with regard to the total cost of the board. However, those skilled in the art will appreciate that the present invention may be used for the manufacturing of different kind of boards; for example it can be used with a board having a different number of layers, including a single layer board and even with a single sided board, wherein the components are connected only onto one face thereof.

The multilayer PCB 100, which has been formed using conventional procedures known in the art, includes several insulating substrates 110 carrying circuit conductors 120. An electrical conductive coating layer 130, typically copper, has been applied onto either board surface. An aperture 140 is drilled through the board 100 in register with two or more conductors to be connected to each other.

Figure 2A:
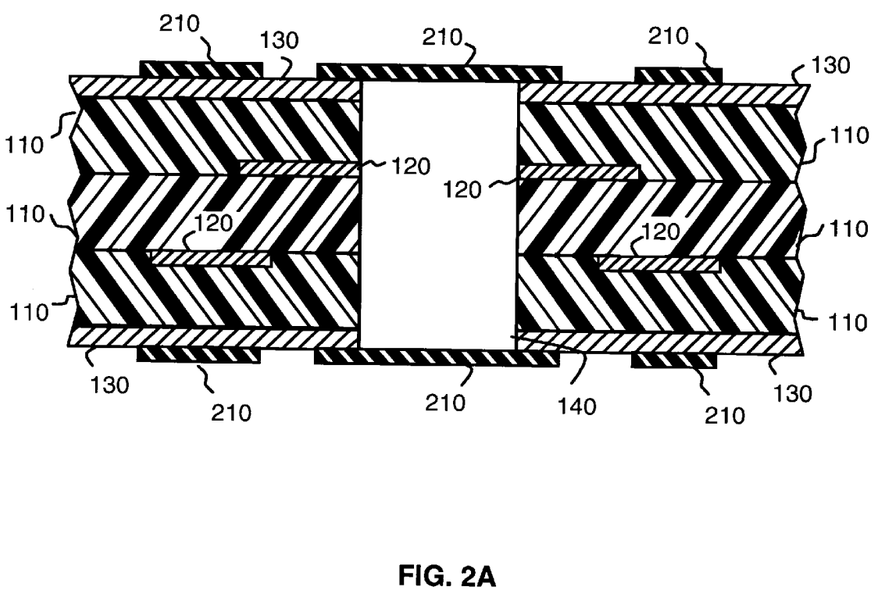
FIG. 2a, 2b and 2c show the steps of providing circuit conductors and conductive projections onto the board;.
Figure 2B:
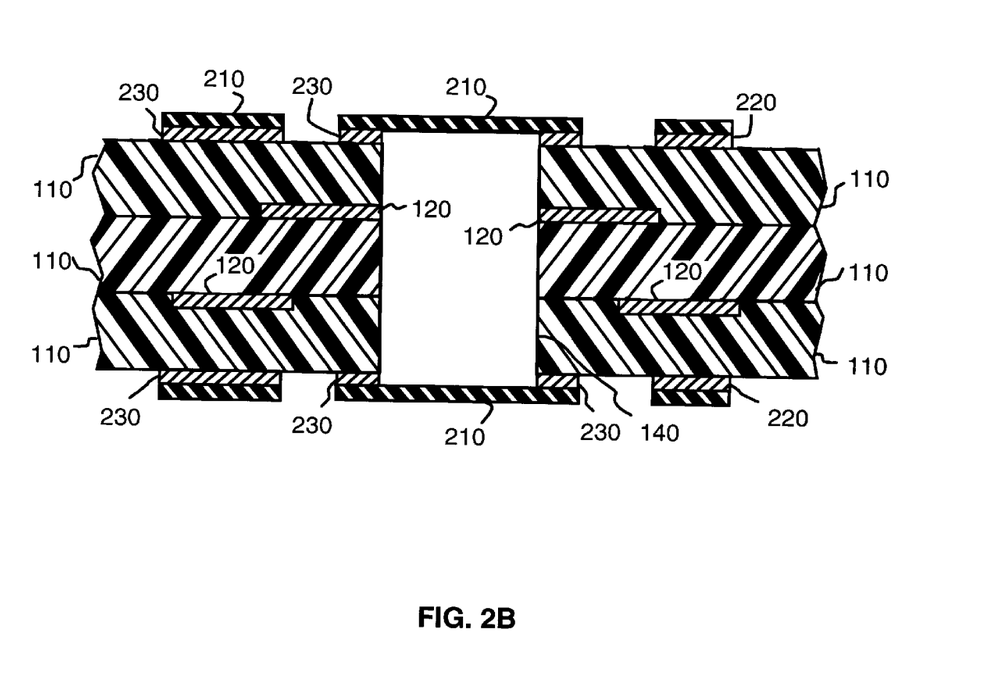
Figure 2C:
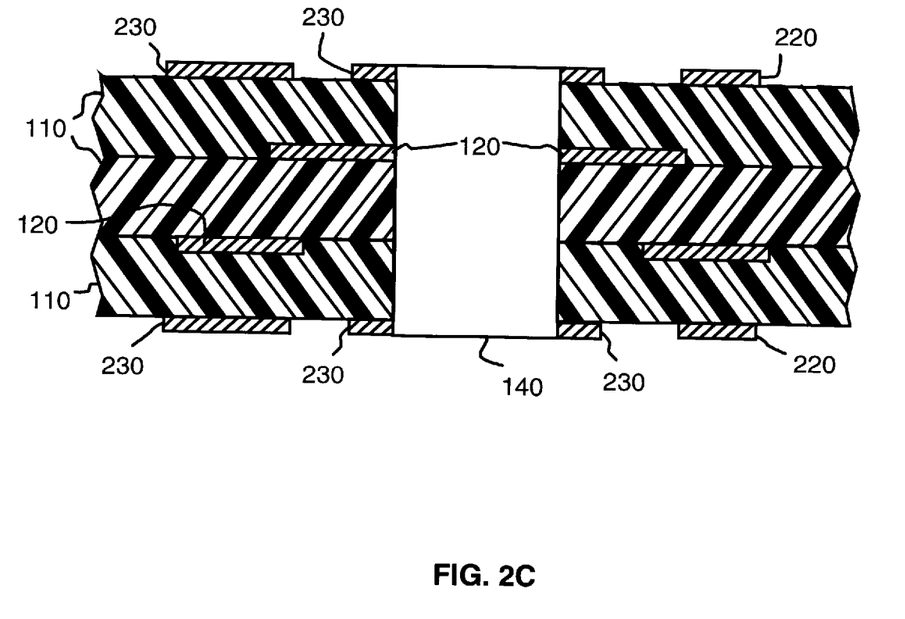

With reference now to FIGS. from 2a, 2b and 2c, the steps of providing circuit conductors and conductive projections onto the board are shown.

Referring in particular to FIG. 2a, an etching mask 210, such as a dry film or wet coating, is provided onto the board 100 according to a conductor and conductive projection pattern to be formed thereon; the etching mask 210 is then exposed and developed.

The coating layer 130 is subsequently etched in FIG. 2b; the etching mask 210 then provides for the formation of the desired circuit conductors 220 and conductive projections 230.

With reference then to FIG. 2c, the etching mask 210 is stripped, obtaining the external layer pattern (PCB layout) according to artwork requirements.

Referring now to FIGS. from 3a to 3e, the steps of selectively electroplating the relatively thick solder onto the conductive projections are depicted.

Figure 3A:
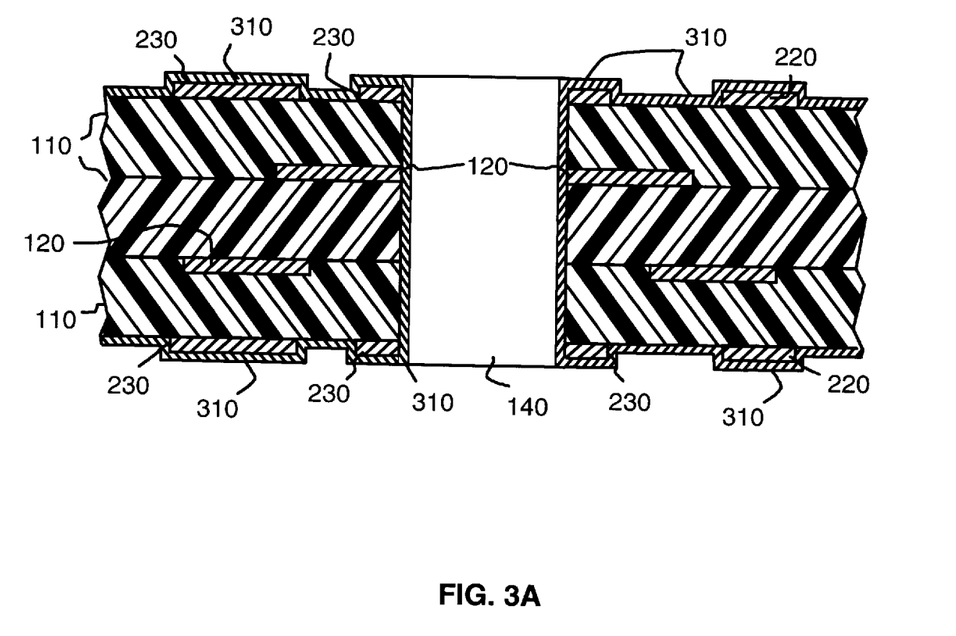
FIG. 3a, 3b, 3c, 3d and 3e depict the steps of selectively electroplating the relatively thick solder onto the conductive projections.

Starting from FIG. 3a, both faces of the board 100 and the walls of the aperture 140 (hole barrel) are rendered continuously conductive by electrolessly applying a conductive layer 310, typically electroless copper, palladium or carbon resin. The conductive layer 310 is applied on the entire surface to obtain conduciveness and to allow successive electroplating; it should be noted that, according to this embodiment of the present invention, the electroless conductive layer is applied after the etching of the conductive coating for providing the circuit conductors and conductive projections, contrary to of the SMT methods known in the art.

Figure 3B:
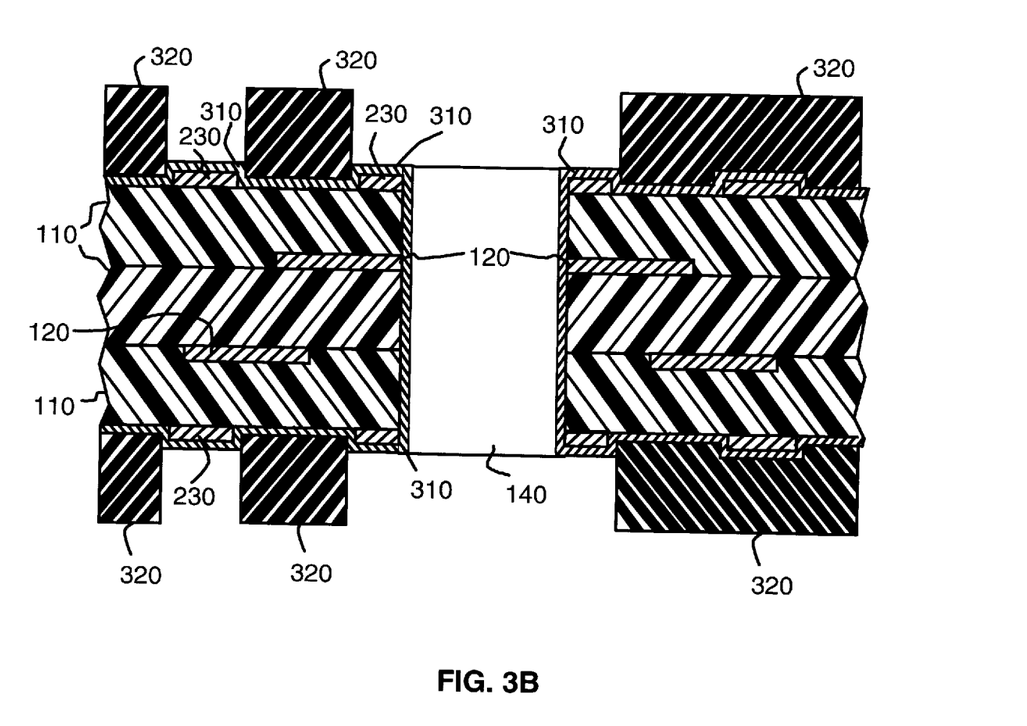

Once the conductive layer 310 has been applied, a relatively thick insulating mask 320 is provided in FIG. 3b; this step includes the application, exposure and development of the insulating mask 320. As clearly seen in comparing FIGS. 2b and 3b, mask 320 is considerably thicker than mask 210 used to define conductors 220 and projections 230. (Mask 320 is also thicker than the solder mask 410 subsequently added below). Preferably, this step (applying mask 320) is performed with a relatively thick water soluble dry film to cover all the surfaces of the PCB 100, plated with the electroless conductive layer 310, excluding only the areas where it is necessary to obtain the electroplating deposition, such as conductive projections and holes. The dry film offers a higher adherence and sealing with the substrate; in addition, the dry film is thicker and water soluble. The dry film deposition offers a good lateral geometrical definition, in the order of 100–200 μm, typically of 120 μm.

The insulating mask 320 is provided with a thickness usually between 50 and 200 μm, preferably of 75 μm. This relatively thick insulating mask 320 allows a relatively thick solder electrodeposition on the selected conductive projections, which is necessary for assembly of the components onto the board.

In the example shown in FIG. 3b, the insulating mask 320 is formed on each face leaving clear a margin surrounding each conductive projection 230, including the ones at the end of the aperture 140.

Figure 3C:
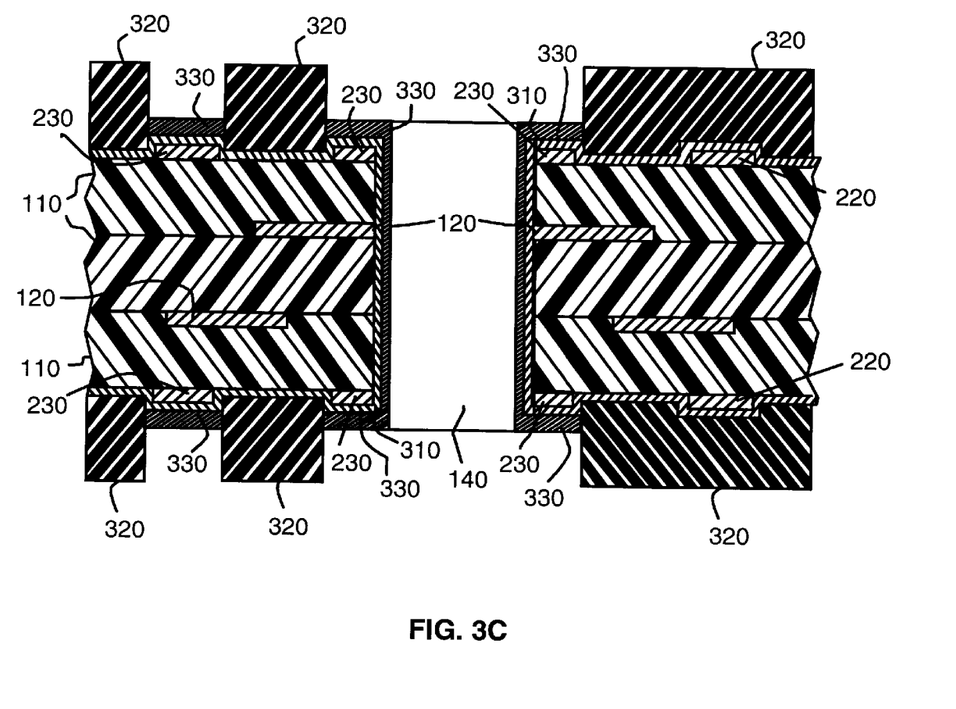

Referring now to FIG. 3c, the board 100 is immersed in an electroplating bath (typically a copper bath) with the continuous conductive layer 310 as a cathode. The walls of the aperture 140 and the exposed margins of the conductive layer 310 are first electroplated with a conductive material 330, in this example copper, so as to build-up a conductive surface on the hole barrel and conductive projections; this building-up is useful to ensure a better electrical connection between the circuits on either face of the board 100.

Figure 3D:
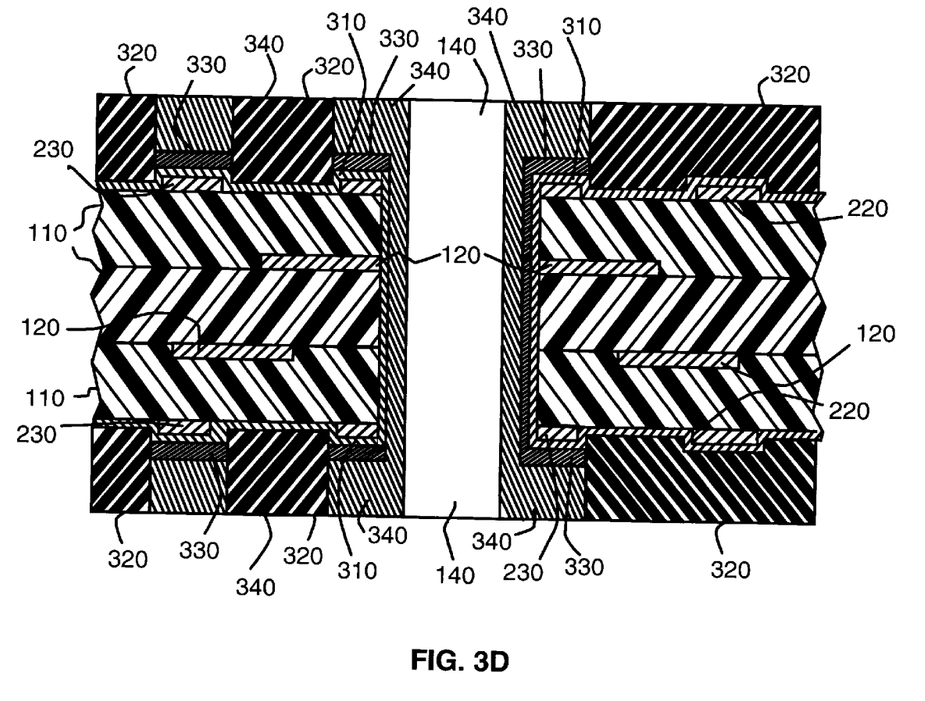

Further to this, in FIG. 3d relatively thick solder 340 is electroplated on top of the conductive material 330. As seen in FIG. 3d, the height of this solder 340 is substantially the same as the height of mask 320. A solder alloy is commonly used; typically, the solder alloy is a lead-tin solder alloy or a lead-free solder alloy, such as tin-bismuth. The electrodeposited solder has usually a thickness between 50 and 120 μm, typically 60 μm; this relatively greater thickness of the electrodeposited solder allows then the assembly of the components onto the board.

Figure 3E:
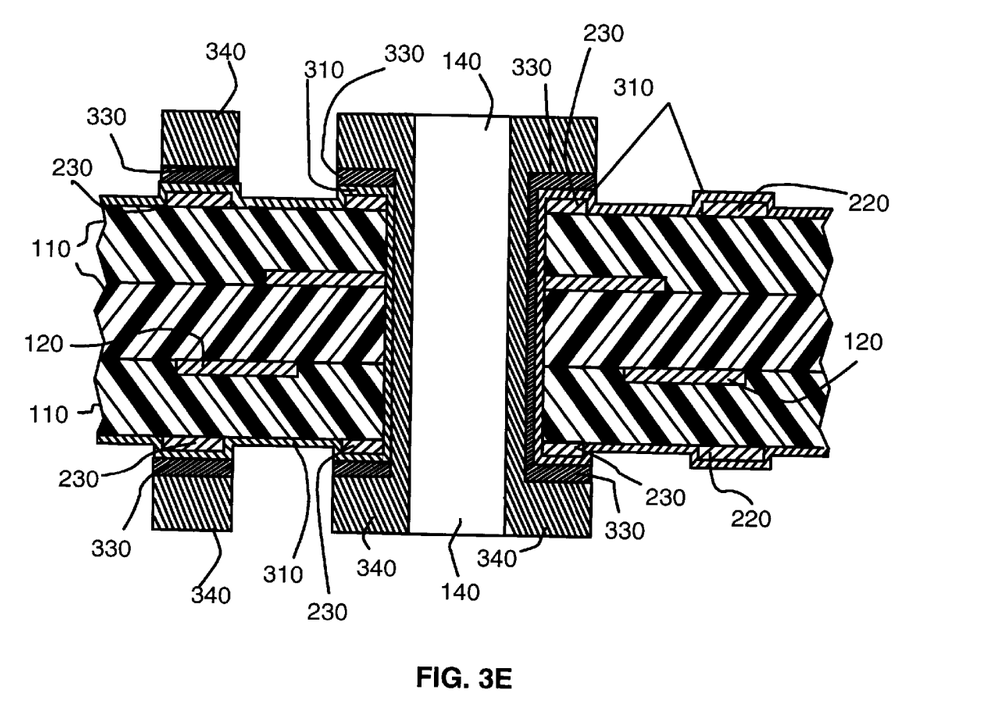

The insulating mask 320 is stripped after the electroplating operations, as shown in FIG. 3e; the board 100 is then provided with relatively thick solder selectively electroplated only onto selected conductive projections 230 and hollows 140 and not onto circuit conductors 220. It should be noted that the alloy selective electroplating is obtained by the current process steps used in a common SMT process, excepting the electroless copper etching, only changing the process step sequence; no additional cost is then involved by the process according to this embodiment of the invention.

Figure 4A:
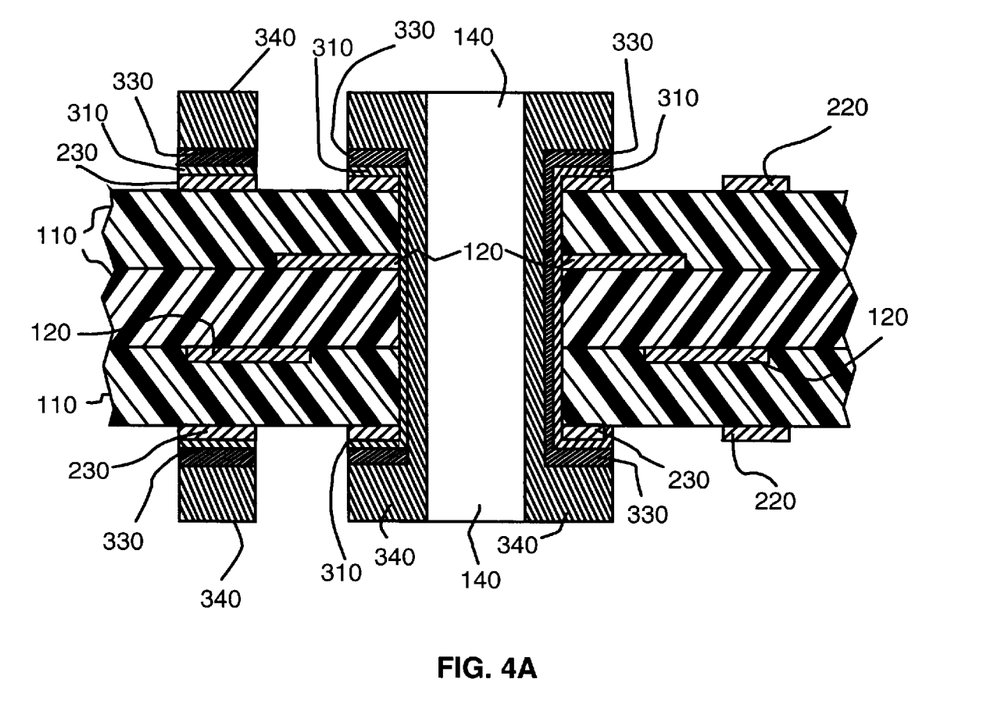
FIG. 4a and 4b show the final steps according to an embodiment of the present invention.
Figure 4B:
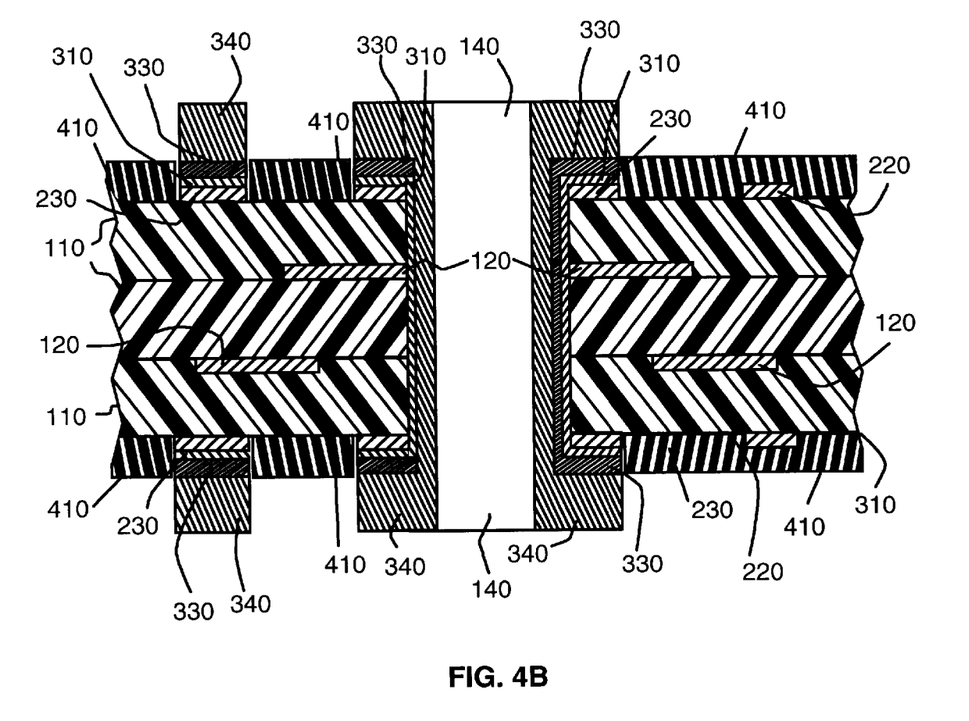

With reference now to FIG. 4a and 4b, the final steps according to an embodiment of the present invention are shown.

Referring in particular to FIG. 4a, the conductive layer 310 in the areas between the conductive projections and the hollows is removed with the aid of a suitable acid; typically, this step is performed by a dedicated etching bath, used to remove only electroless copper or palladium or carbon resin. After said conductive layer has been removed, the solder is reflowed or pickled in order to achieve and to maintain the solderability performance.

A solder mask 410 is then provided in FIG. 4b, as in the usual PCB process production flow; the double-sided printed circuit board 100 is then ready for use.

The printed circuit board 100 is typically used for the manufacturing of an electronic card, by assembling different components onto the board 100. In the SMT process, the electrical contacts of the components are connected, through the deposited relatively thick solder 340, to the conductive projections 230 provided on the substrate surface 110 of the board 100; particularly, in the FCA process, the chips, provided with several ball contacts, are bonded onto small PCB conductive projections 230.

The electronic card manufacturing process starts with the step of dispensing a flux in order to activate the solder and to provide adhesivity. The board 100 can then be used for connecting the desired components onto the relative conductive projections 230.

It should be noted that the process according to the present invention does not require the solder paste or adhesive screening used in common SMT processes, or the injection of the melted solder onto the conductive projections used in some FCA processes. This avoids the high cost of the solder injection machine and the high complexity of the conductive adhesive or solder paste screening step; the elimination of the screening improves significantly the process yield and it reduces the assembly cycle time and the man power. In the methods known in the art, one operator must be dedicated to the solder paste or the conductive adhesive screener, whose setup (the matching of the board conductive projections with stencil window) is very critical because it is required a high mechanical precision on large surfaces; Moreover the stencil cleaning, while the machine is operating, is continuously necessary and as is the stencil washing at the end of the production resulting in loss of a lot of time. On the contrary, the flux dispensing step is a far less critical operation; the flux is indeed an homogeneous organic material (contrary to the solder paste and the conductive adhesive that are a suspension of a powder in an organic matrix) whose rheology is stable and well controlled.

Different kind of fluxes can be used in the above described methods, either water soluble or no clean; preferably, the SMT process includes the step of dispensing a no clean flux, so that no cleaning is required in the whole electronic card assembly process; a single operator is then enough to manage contemporary the flux dispensing and component placement machine.

The flux can be dispensed by several methods, such as screening, spray, roll, syringe. In the flux dispensing by syringe, this device is moved by an automatic and programmable machine, which is able to move through the conductive projections with high precision; the method is very simple, quick, repeatable and clean.

Following the flux dispensing step, different components, such as chips, transistors, capacitors, resistors and so on, are placed onto the board 100, connected to the related conductive projections 230.

The electronic card manufacturing process is then completed by reflowing the relatively thick solder 340 provided onto the conductive projections 230, in order to provide mechanical and electrical connection with the components placed onto the board 100.

We claim:

1. A method of manufacturing a printed circuit board adapted for having surface mounted components positioned thereon, said method comprising:

providing an insulating substrate having an electrically conductive layer thereon;

utilizing a first mask to define circuit conductors and electrically conductive projections from said electrically conductive layer on said insulating substrate by etching said electrically conductive layer not protected by said first mask;

removing said first mask;

electrolessly applying a conducting layer onto substantially the entire external surface of said substrate;

positioning a second mask relatively thicker than said first mask and having a thickness of between 50 and 200 $\mu$m onto said substrate but not over said conductive projections;

electroplating a conductive material over said conducting layer electrolessly applied on said conductive projections;

electroplating to a height approximately the same as the height of said relatively thicker second mask a layer of solder relatively thicker than said conductive material electroplated on said conductive projections and having a thickness of between 50 and 120 $\mu$m onto said conductive material electroplated on said conductive projections wherein said solder is sufficiently thick to assemble components onto said printed circuit board; and thereafter removing said second mask to define said printed circuit board.

2. The method of claim 1 further including dispensing flux onto said printed circuit board.

3. The method of claim 2 wherein said flux is dispensed using a syringe.

4. The method of claim 1 further including connecting components to said electrically conductive projections having said relatively thick layer of solder thereon.

5. The method of claim 4 wherein said connecting of said components includes the step of reflowing said relatively thick layer of solder.

* * * * *